US010966361B2

(12) United States Patent
Sakurayama et al.

(10) Patent No.: US 10,966,361 B2
(45) Date of Patent: Mar. 30, 2021

(54) MACHINE FOR PERFORMING SPECIFIED WORK TO A PRINTED CIRCUIT BOARD

(71) Applicant: FUJI CORPORATION, Chiryu (JP)

(72) Inventors: Takeshi Sakurayama, Chiryu (JP); Mitsuru Sanji, Nagoya (JP); Hidenori Goto, Anjo (JP); Kota Niwa, Anjo (JP)

(73) Assignee: FUJI CORPORATION, Chiryu (JP)

( * ) Notice: Subject to any disclaimer, the term of this patent is extended or adjusted under 35 U.S.C. 154(b) by 194 days.

(21) Appl. No.: 16/096,057

(22) PCT Filed: Apr. 26, 2016

(86) PCT No.: PCT/JP2016/063094
§ 371 (c)(1),
(2) Date: Oct. 24, 2018

(87) PCT Pub. No.: WO2017/187527
PCT Pub. Date: Nov. 2, 2017

(65) Prior Publication Data
US 2019/0133010 A1 May 2, 2019

(51) Int. Cl.
*B23P 19/00* (2006.01)
*H05K 13/08* (2006.01)
*H05K 13/04* (2006.01)

(52) U.S. Cl.
CPC ..... *H05K 13/0815* (2018.08); *H05K 13/0404* (2013.01); *H05K 13/0812* (2018.08); *Y10T 29/53174* (2015.01)

(58) Field of Classification Search
CPC ............. H01L 21/681; H01L 2224/951; H01L 2224/95121; H01L 22/20; H01L 22/26;
(Continued)

(56) References Cited

U.S. PATENT DOCUMENTS 6,506,614 B1    1/2003  Strassmann
10,784,129 B2*  9/2020  Sugihara .................. H01L 24/97
2017/0227199 A1  8/2017  Sugihara

FOREIGN PATENT DOCUMENTS

JP    9-307300 A    11/1997
JP    2001-136000 A    5/2001
(Continued)

OTHER PUBLICATIONS

International Search Report dated Aug. 9, 2016, in PCT/JP2016/063094, filed Apr. 26, 2016.

*Primary Examiner* — Thiem D Phan
(74) *Attorney, Agent, or Firm* — Oblon, McClelland, Maier & Neustadt, L.L.P.

(57) ABSTRACT

A dedicated correction value related to the mounting position of an upper surface recognition component with a characteristic section on an upper surface thereof is memorized in correction value folder 43a of an HDD, and when performing mounting work of mounting the upper surface recognition component on a board, a position deviation amount of the characteristic section is acquired based on an image of the upper surface of the upper surface recognition component captured by a mark camera, and the component is mounted at the mounting position based on the acquired position deviation amount and the dedicated correction value. Accordingly, it is possible to mount the specific component at a corrected mounting position such that the position of the characteristic section is appropriate, thereby improving mounting accuracy for the upper surface recognition component.

7 Claims, 10 Drawing Sheets

(58) Field of Classification Search
CPC ............... G01R 31/01; H05K 13/0413; H05K 13/0813; H05K 3/32; H05K 13/0812; H05K 13/0815; Y10T 29/49004; Y10T 29/53174; Y10T 156/17
USPC ......... 29/739, 720, 729, 740, 741, 743, 829, 29/832, 833
See application file for complete search history.

(56) References Cited

FOREIGN PATENT DOCUMENTS

| | | | |
|---|---|---|---|
| JP | 2013-207270 A | 10/2013 | |
| JP | 5779386 B2 | 9/2015 | |
| WO | WO 2012/144282 A1 | 10/2012 | |
| WO | WO14207807 A1 * | 6/2013 | ......... H05K 13/0413 |
| WO | WO 2016/020975 A1 | 2/2016 | |

* cited by examiner (a)

(b)

(a)

(b)

(c)

MACHINE FOR PERFORMING SPECIFIED WORK TO A PRINTED CIRCUIT BOARD

TECHNICAL FIELD

The present application relates to a board work machine.

BACKGROUND ART

Conventionally, with a board work machine that performs various work such as mounting components on a board, the mounting accuracy is calibrated in advance and adjusted for during mounting of components. For example, in a board work machine of patent literature 1, calibration-use chip components are mounted at predetermined mounting positions on a board provided with calibration marks, then the calibration-use chip components and calibration marks are imaged. Next, a center position with respect to the outline of the calibration-use chip components is detected in the captured image using the position of the calibration marks as a reference, the difference between the detected center position and a predetermined mounting position is detected as the mounting accuracy, and the data used for mounting the component on the board is corrected using the detected mounting accuracy.

CITATION LIST

Patent Literature

Patent literature 1: JP-A-2001-136000

BRIEF SUMMARY

Technical Problem

However, among components mounted on boards, there are various types of components such as components with a characteristic section for manifesting the functionality of the component formed on an upper surface of the component, and components without such a characteristic section formed on the upper surface. With components with a characteristic section formed on an upper surface, there are cases in which the characteristic section is formed at a position shifted from the center position with respect to the component outline.

In such a case, even if the mounting position is corrected based on the mounting accuracy calibrated from the center position with respect to the outline of a calibration-use chip component as with the substrate work machine described above, the mounting position of the characteristic section is shifted, and the mounting accuracy is not improved.

A main object of the present disclosure is to improve the mounting accuracy of a component with a characteristic section formed on an upper surface of the component.

Solution to Problem

The present disclosure uses the following means to achieve the above object.

A board work machine of the present disclosure is for performing specified work with respect to a board, the board work machine including:

a mounting head configured to pick up a component and move the component to a mounting position on the board;

a memory section configured to memorize a correction value related to the mounting position of the component and to memorize at least a specific correction value related to the mounting position of a specific component that includes a specified characteristic section on an upper surface of the specific component;

an upper imaging device configured to image the component from above; and a control device configured to, in a case of performing mounting work of mounting the specific component on the board, acquire a position deviation amount of the specific component based on an upper surface image of the upper surface of the specific component captured by the upper imaging device and control the mounting head to mount the specific component at the mounting position corrected based on the acquired position deviation amount and the specific correction value.

With the board work machine of the present disclosure, a specific correction value related to a mounting position of a specific component with a specified characteristic section on an upper surface is memorized in advance on a memory section, and when performing mounting work of mounting the specific component on a board, a position deviation amount of the characteristic section is acquired based on an upper surface image of the upper surface of the specific component captured by an upper imaging device, and a mounting head is controlled to mount the specific component at a correction mounting position based on the acquired position deviation amount and the specific correction value. Accordingly, it is possible to mount the specific component at a corrected mounting position such that the position of the characteristic section is appropriate, thereby improving mounting accuracy for the specific component formed with a characteristic section on an upper surface.

DESCRIPTION OF EMBODIMENTS

Figure 1:
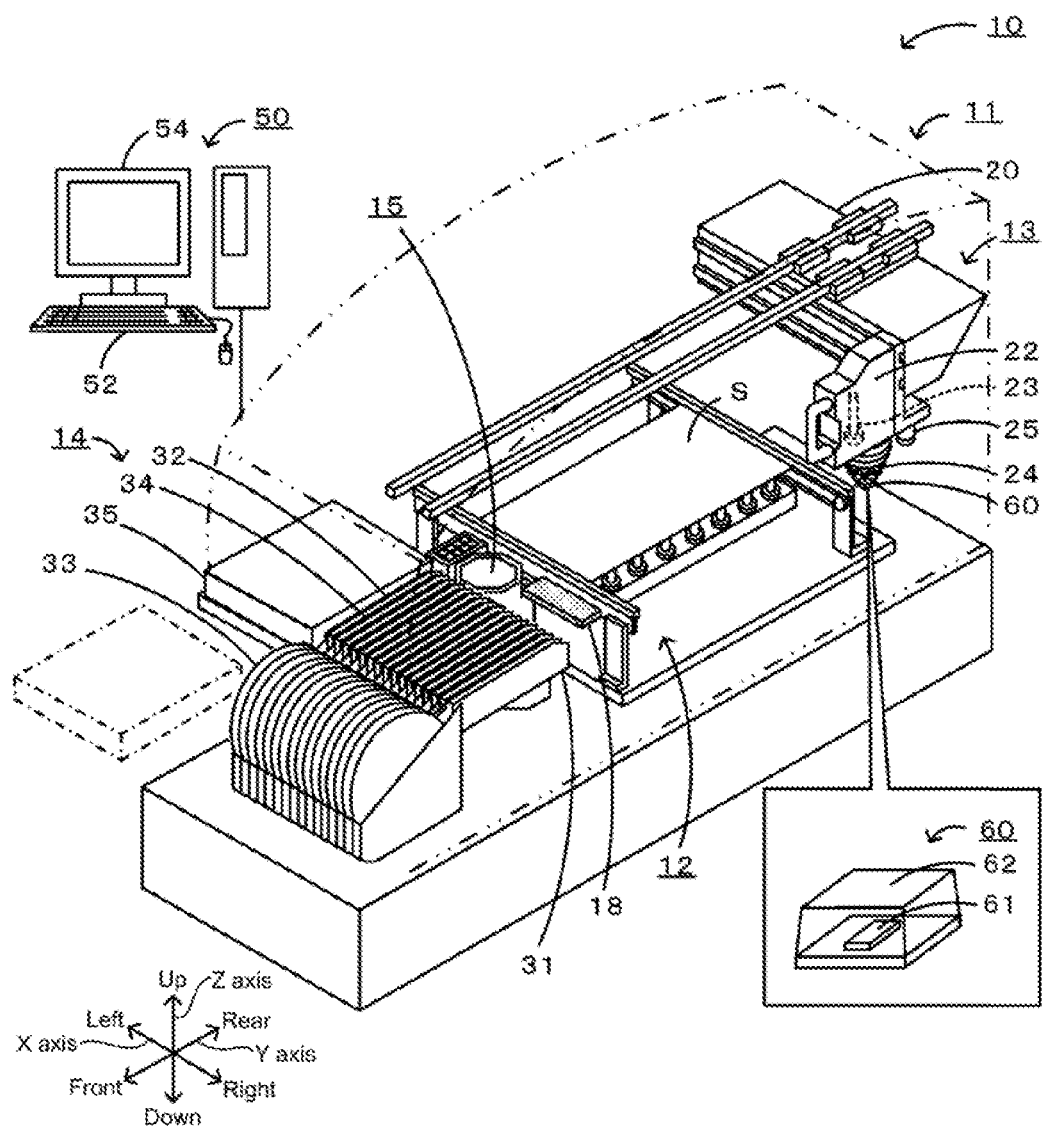
FIG. 1 shows an example of mounting system 10.
Figure 2:
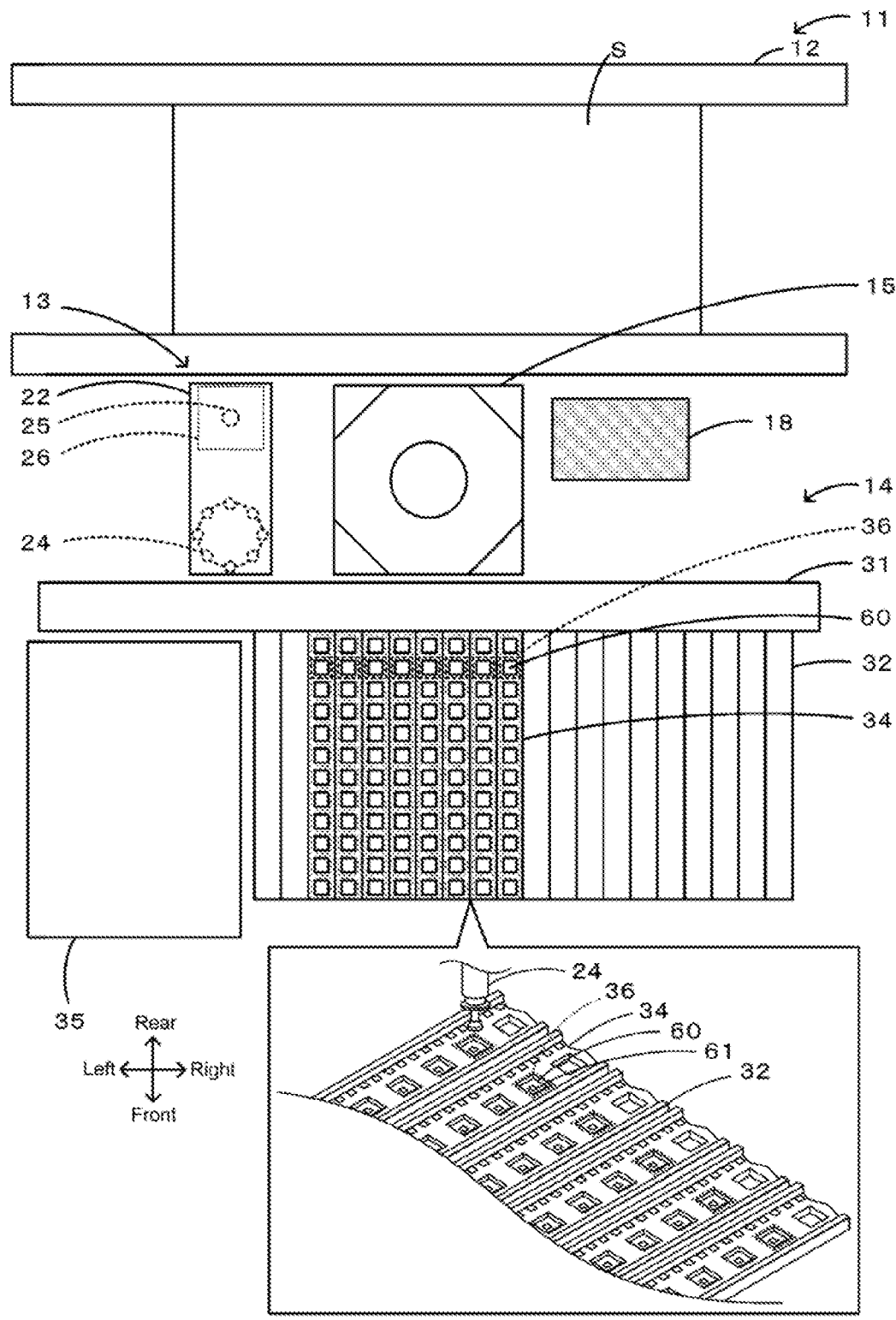
FIG. 2 schematically shows the configuration of mounter 11.
Figure 3:
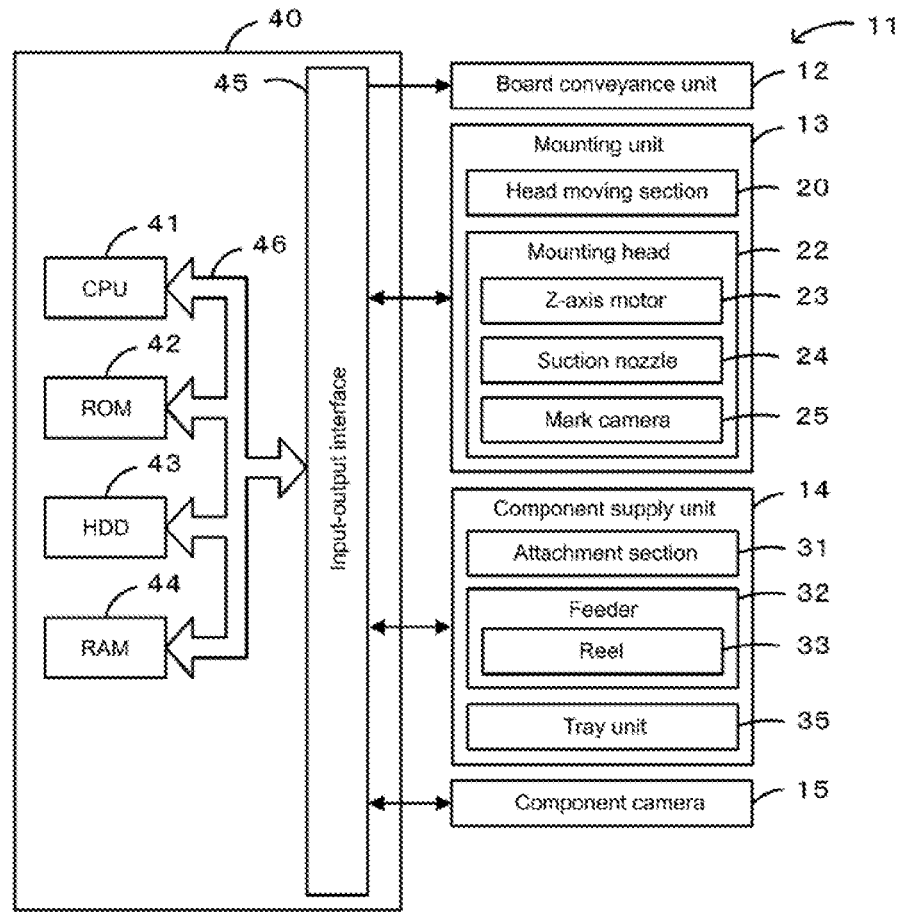
FIG. 3 is a block diagram showing electrical connections of mounter 11.

FIG. 1 shows an example of mounting system 10; FIG. 2 schematically shows the configuration of mounter 11; FIG. 3 is a block diagram showing electrical connections of mounter 11. Mounting system 10, for example, performs mounting processing for mounting components on board S. Mounting system 10 is provided with mounter 11 and management computer 50. Multiple mounters 11 that perform mounting processing of mounting components on board S are arranged from upstream to downstream in mounting system 10. FIG. 1 shows only one mounter 11. Note that, in FIG. 1, the left-right direction is the X-axis direction, the front-rear direction is the Y-axis direction, and the up-down direction is the Z-axis direction.

As shown in FIGS. 1 to 3, mounter 11 is provided with board conveyance unit 12, mounting unit 13, component supply unit 14, component camera 15, loading stand 18, and control device 40. Board conveyance unit 12 loads board S, conveys board S, fixes board S at a mounting position, and unloads board S.

Board conveyance unit 12 includes a pair of conveyor belts provided extending in a left-right direction and separated in the front-rear direction of FIG. 1. Board S is conveyed by these conveyor belts.

Mounter 11 performs mounting processing of general-purpose components (also referred to as lower surface recognition components, non-specific components, or normal components) for which the shape or the like can be recognized by imaging the component from the bottom side and mounting processing of specific components (also referred to as upper surface recognition components) with characteristic section 61 on an upper surface thereof (as shown in FIG. 1). Specific component 60 includes characteristic section 61 the position and shape and the like of which can only be recognized from above (also referred to as upper surface recognition), and contact surface 62 that is an upper surface contacted during pickup. Characteristic section 61, for example, may be a light-emitting body that emits light. That is, specific component 60 may be an LED component formed with an upper section of transparent resin that allows light to pass through.

Mounting unit 13 picks up a component from component supply unit 14 and mounts the component on board S fixed by board conveyance unit 12. Mounting unit 13 is provided with head moving section 20, mounting head 22, and suction nozzle 24. Head moving section 20 is provided with sliders that move in XY directions guided by guide rails and motors that drive the sliders. Mounting head 22 is removably attached to a slider and is movable in the XY directions by head moving section 20. At least one suction nozzle 24 is removably attached to an underside of mounting head 22. Suction nozzle 24 is a pickup member for picking up a component using pressure. Mounting head 22 is equipped with Z-axis motor 23 and the height of suction nozzle 24 is adjusted along the Z-axis by Z-axis motor 23. Also, mounting head 22 is provided with a rotation device that uses a drive motor, not shown, to rotate (on its own axis) suction nozzle 24, such that the angle of the component picked up by suction nozzle 24 can be adjusted. Mounting head 22 is configured such that a cylindrical holding body holding multiple (for example, eight or twelve) suction nozzles is rotated, and the suction nozzles 24 are able to be moved downwards at a specified location (here, at a point furthest towards the front of the device).

Mark camera 25 is provided on mounting head 22. Mark camera 25, for example, is able to image board S or components from above. Mark camera 25 is provided on an underside of mounting head 22 (or a slider) and moves together with mounting head 22. Imaging region 26 (refer to FIG. 2) of mark camera 25 is below the camera, and mark camera 25 images reference marks on board S used for recognizing the position of board S, and outputs the images to control device 40.

Also, mark camera 25 images an upper surface of specific component 60, and outputs the images to control device 40. Mark camera 25 moves in the XY directions with the movement of mounting head 22.

With component supply unit 14, multiple feeders 32 provided with reels 33 are removably attached to attachment section 31 arranged at the front side of mounter 11. Tape 34 is wound around each reel 33, and multiple components are held in tape 34 in a lengthwise direction separated by regular intervals. Tape 34 is unwound to the rear from reel 33, and with a component exposed, is fed to pickup position 36 (refer to FIG. 2) at which the component is picked up by suction nozzle 24. Component supply unit 14 is provided with tray unit 35 that includes a tray on which components are loaded in multiple rows.

Component camera 15 is arranged between board conveyance unit 12 and component supply unit 14. The imaging range of component camera 15 is above component camera 15. Component camera 15 images a component held by suction nozzle 24 when suction nozzle 24 holding the component passes above component camera 15, and outputs the image to control device 40.

Loading stand 18 is arranged between board conveyance device 12 and component supply unit 14, and to the side of component camera 15. Loading stand 18 is supported such that an upper surface thereof on which components are loaded is horizontal, and is used as a provisional loading stand for specific components 60. When specific component 60 is loaded on loading stand 18, the orientation of specific component 60 is more stable compared to when specific component 60 is stored in a storage section of tape 34. Loading stand 18 may be formed with a size such that a maximum quantity of specific components 60 that can be loaded is the maximum quantity of specific components 60 that can be picked up at one time by mounting head 22.

As shown in FIG. 3, control device 40 is configured from a microprocessor based around CPU 41, ROM 42 that memorizes a processing program, HDD 43 that memorizes various data, RAM 44 used as working memory, input-output interface 45 for performing communication of electric signals with external devices, and so on, and these are connected by bus 46. Control device 40 outputs control signals to board conveyance unit 12, mounting unit 13, component supply unit 14, and component camera 15, and receives signals from mounting unit 13, component supply unit 14, and component camera 15.

Management computer (PC) 50 manages information of each device of mounting system 10. Management PC 50 is provided with a control device configured from a microprocessor based around a CPU, and this control device is provided with ROM that memorizes a processing program, an HDD that memorizes various data, RAM used as working memory, an input-output interface for performing communication of electric signals with external devices, and so on. Management PC 50 is provided with input device 52 such as a keyboard and mouse for an operator to input various commands, and display 54 for displaying various information.

Figure 4:
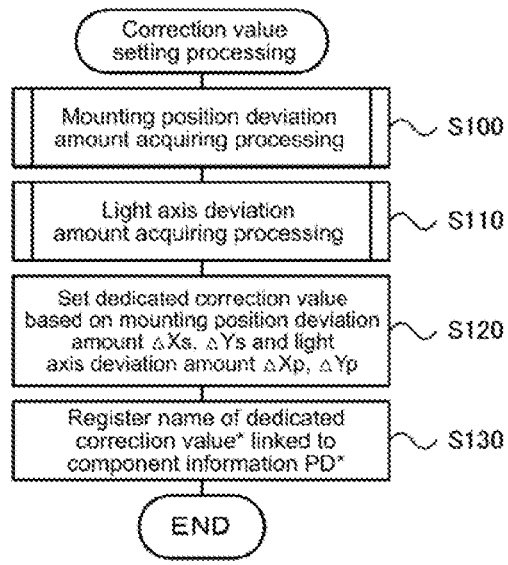
FIG. 4 is a flowchart illustrating an example of correction value setting processing.

Described below is processing of component mounting system 10 configured as above. Here, component mounting system 10 of the present embodiment is able to correct position deviations of components when mounting components on board S using a predetermined correction value using jig board S0. Below, after describing correction value setting processing, mounting processing is described. FIG. 4 is a flowchart illustrating an example of correction value setting processing. This processing is performed by control device 40 with jig board S0 loaded to and fixed at a mounting position by board conveyance unit 12.

Figure 5:
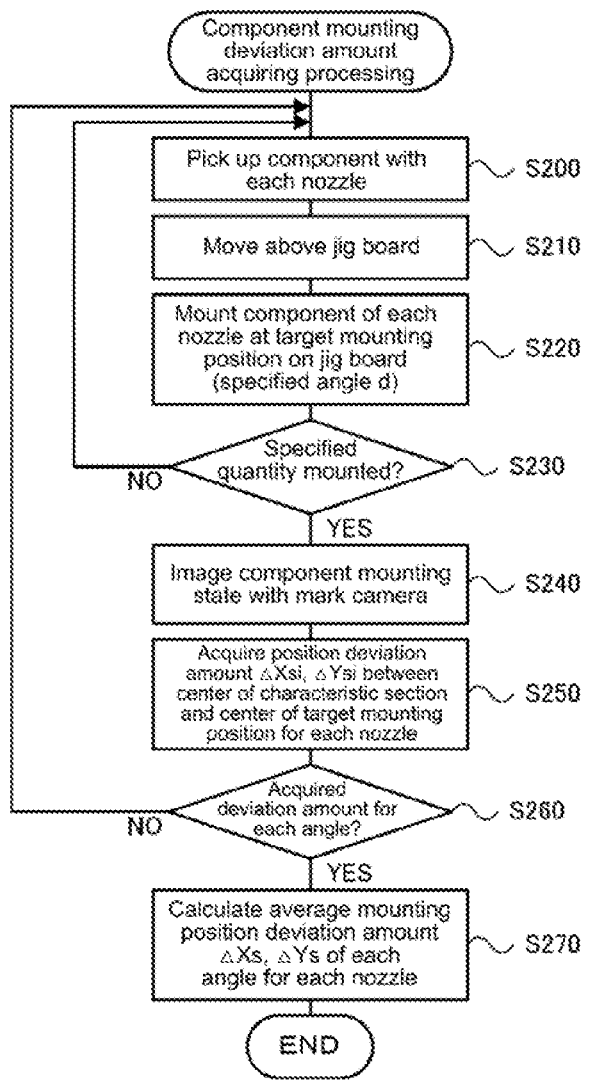
FIG. 5 is a flowchart illustrating an example of mounting position deviation amount acquiring processing.
Figure 6:
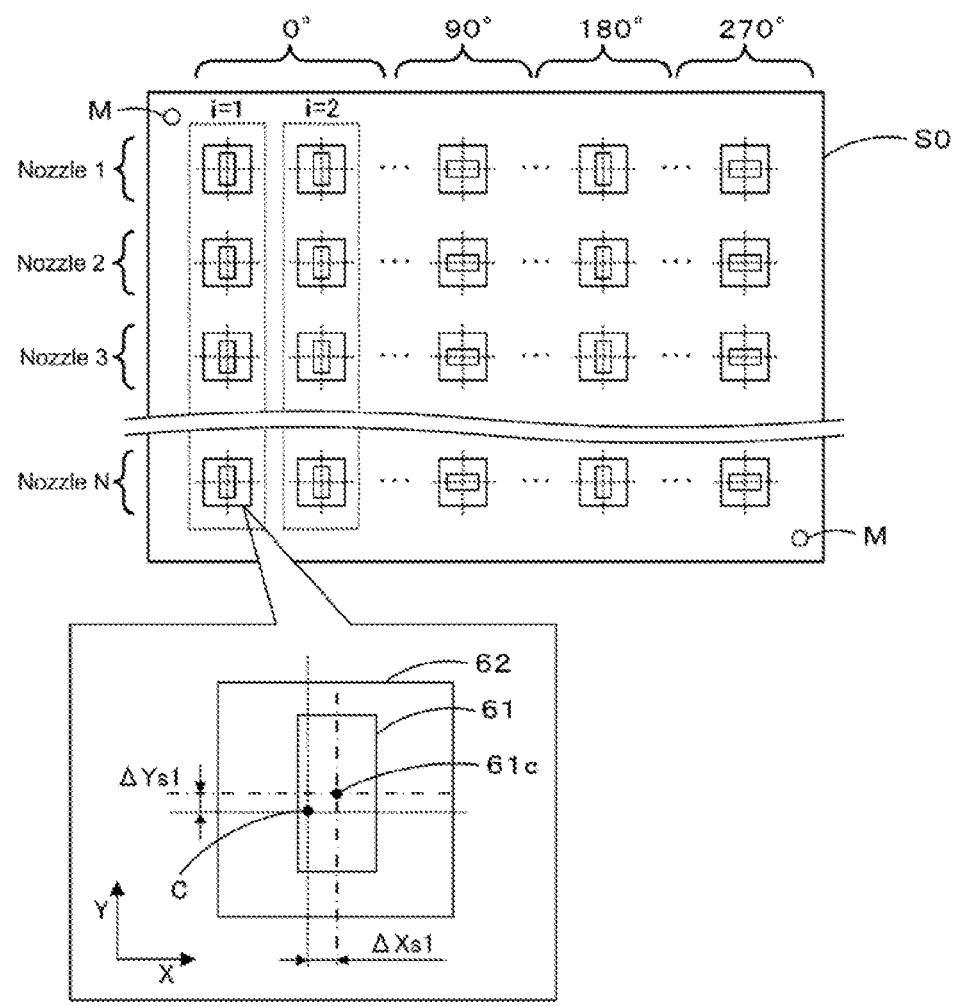
FIG. 6 illustrates the state when acquiring the mounting position deviation amount.
Figure 7:
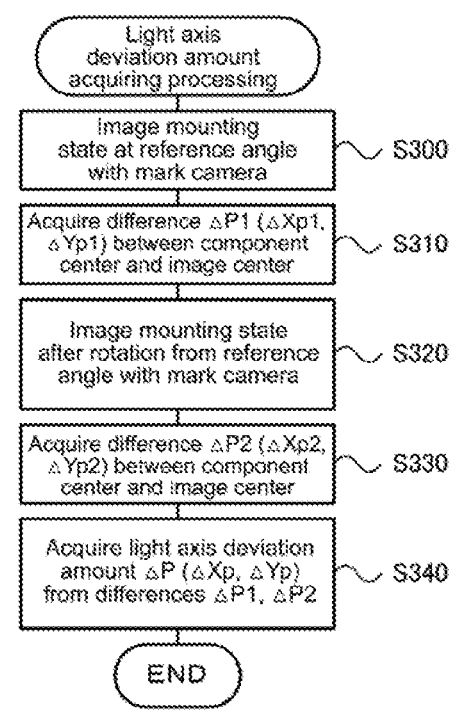
FIG. 7 is a flowchart illustrating an example of light axis deviation amount acquiring processing.
Figure 8:
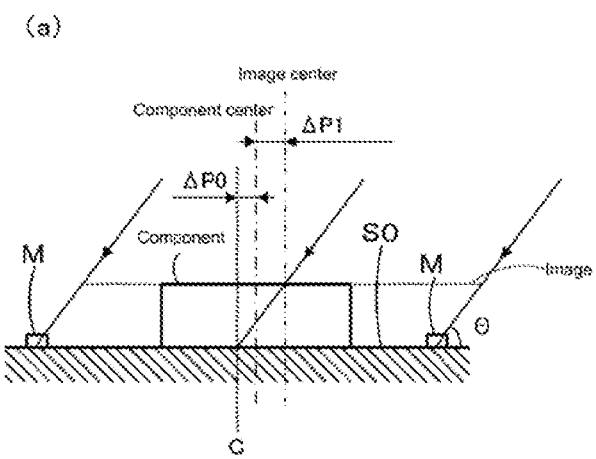
FIG. 8 illustrates the state when acquiring the light axis deviation amount.
Figure 8:
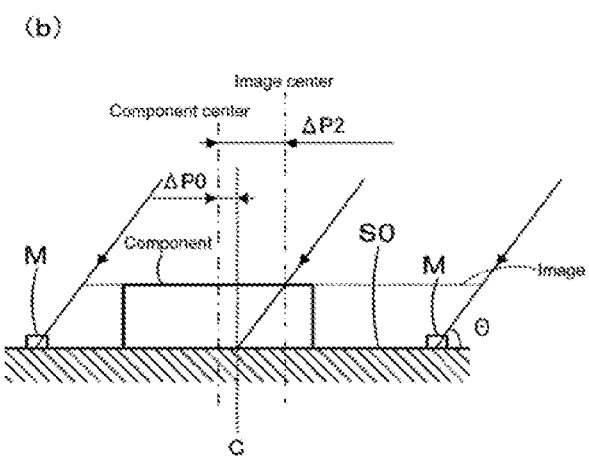

With the correction value setting processing of FIG. 4, CPU 41 of control device 40 performs mounting position deviation amount acquiring processing (S100) and light axis deviation amount acquiring processing (S110). Mounting position deviation amount acquiring processing is for acquiring a position deviation amount of a mounting state such that a dedicated correction value (specific correction value) can be set in accordance with the type of the upper surface recognition component (specific component). Light axis deviation amount acquiring processing is for acquiring a position deviation amount due to an angle of a light axis of mark camera 25 such that a position deviation correction value due to the angle of the light axis can be set. FIG. 5 is a flowchart illustrating an example of mounting position deviation amount acquiring processing; FIG. 6 illustrates the state when acquiring the mounting position deviation amount; FIG. 7 is a flowchart illustrating an example of light axis deviation amount acquiring processing; FIG. 8 illustrates the state when acquiring the light axis deviation amount.

With the mounting position deviation amount acquiring processing of FIG. 5, CPU 41 of control device 40, first, collects components by picking up a component (upper surface recognition component) using each of the suction nozzles 24 of mounting head 22 (S200) and moves mounting head 22 above jig board S0 (S210). Then, CPU 41 mounts each of the components held by the suction nozzles 24 at a specified target mounting position on jig board S0 (S220). Here, CPU 41 performs mounting with suction nozzles 24 rotated to a specified angle d by a drive motor, which is not shown. As the specified angle d, for example, four angles, 0, 90, 180, and 270 degrees, may be selected consecutively. The mounting position deviation amount acquiring processing acquires the mounting position deviation amount at each of these angles. Note that in FIG. 6, to aid understanding, components (upper surface recognition components) are shown mounted at each specified angle d on a single jig board S0, but a single jig board S0 may be mounted with components for each specified angle d. Also, instead of jig board S0, a board S actually used in mounting processing may be used. Further, in the mounting position deviation amount acquiring processing, when mounting an upper surface recognition component on jig board S0, a component position deviation amount may be acquired based on an image captured of the component from below by component camera 15, and the component may be mounted at a corrected mounting position based on the acquired position deviation amount and a lower surface general-purpose correction value that is a general-purpose correction value for lower surface recognition components. Alternatively, a component position deviation amount may be acquired based on an image captured of the upper surface recognition component using mark camera 25, and the component may be mounted at a correction mounting position based on the acquired position deviation amount and an upper surface general-purpose correction value that is a general-purpose value for upper surface recognition components. When imaging an upper surface recognition component using mark camera 25, imaging may be performed with the component stored in tape 34 of feeder 32 loaded on component supply unit 14 or stored in a tray of tray unit 35 loaded on supply unit 14, or imaging may be performed with the component temporary loaded on loading stand 18.

CPU 41, having mounted a component (upper surface recognition component) held by a suction nozzle 24, determines whether a specified quantity of components has been mounted (S230), and if a specified quantity of components has not been mounted, returns to S200 and repeats processing from there. The specified quantity is set to a value such that it is possible to calculate with good accuracy a correction value that curtails variation in the position deviation for each specified angle d of each suction nozzle 24, for example, several tens of components. Note that in FIG. 6, for a specified angle d of 0 degrees, two components each (i=1, i=2) are shown as picked up by each suction nozzle 24, but actually a larger quantity of components is mounted. CPU 41, if determining that the specified quantity of components has been mounted in S230, images the mounting state of the components using mark camera 25 (S240), and acquires position deviation amounts $\Delta Xsi$ and $\Delta Ysi$ in the XY directions for each component based on the captured images (S250). CPU 41, as shown by the enlarged section in FIG. 6, separately for each suction nozzle 24 and for the specified quantity of components, acquires the difference (position deviation amount) in each of the X direction and the Y direction between center 61c of characteristic section 61 and a target mounting center C determined, for example, based on specified marks M of jig board S0. Note that, multiple marks M corresponding to each of the target mounting centers C may be formed on jig board S0. Here, with an upper surface recognition component 60 with characteristic section 61 on an upper surface, due to manufacturing variances, there are cases in which center 61c of characteristic section 61 is at a position deviated with respect to the center of the outline of the component. Therefore, CPU 41, by acquiring a position deviation amount between center 61c of characteristic section 61 and target mounting center C in S250, it is possible to reflect a trend in deviation of characteristic section 61 in the dedicated correction value.

Next, CPU 41 determines whether a position deviation amount for each specified angle d has been acquired (S260), and if determining that it has not, returns to S200 and repeats processing from there. CPU 41, by repeating such processing, mounts the specified quantity of components at each specified angle d on jig board S0, and acquires position deviation amount $\Delta Xsi$ and $\Delta Ysi$ in the XY directions for each component. Further, CPU 41, upon determining that the position deviation amount for each specified angle d has been acquired, calculates the average mounting position deviation amount $\Delta Xs$, $\Delta Ys$ for each specified angle d for each suction nozzle 24 separately (S270), then ends mounting position deviation amount acquiring processing. In S270, CPU 41, with respect to each of the components mounted by each of the suction nozzles 24 (nozzles 1 to N in FIG. 6), acquires the average value of position deviation amount $\Delta Xsi$ of each specified angle d (0, 90, 180, and 270 degrees) as mounting position deviation amount $\Delta Xs$, and acquires the average value of position deviation amount $\Delta Ysi$ of each specified angle d as mounting position deviation amount $\Delta Ys$. Therefore, CPU 41, in a case in which, for example, mounting head 22 is capable of holding eight suction nozzles 24, calculates a total of 32 mounting position deviation amounts $\Delta Xs$, $\Delta Ys$ for four specified angles d of each of the eight suction nozzles 24 separately (separately for each nozzle position).

With the light axis deviation amount acquiring processing of FIG. 7, CPU 41 of control device 40, first, images a component in a mounting state at a reference angle using mark camera 25 (S300). Here, the reference angle, for example, may be a specified angle d of 0 degrees in the direction of jig board S0 as shown in FIG. 6. Therefore, CPU 41, instead of capturing an image with mark camera 25 in S300, may acquire the image captured at the specified angle of 0 degrees in S240 of mounting position deviation amount acquiring processing. Next, CPU 41 acquires difference ΔP1 (ΔXp1, ΔYp1) between the component center and image center from the image captured in S300 (S310).

Here, as shown in FIG. 8(*a*), in a case in which the light axis is tilted at an angle (for example, angle θ), the center in the image (image center) captured by mark camera 25 (refer to the dotted lines in the figure) will be shifted with respect to the target mounting center C. Further, actually, although the component center is shifted with respect to target mounting center C in the right direction in FIG. 8(*a*) by ΔP0 (ΔXp0 assuming the X direction), in the image captured by mark camera 25, this will appear as though the component center is shifted with respect to the image center in the left direction by ΔP1 (ΔXp1 assuming the X direction). Therefore, CPU 41, if the light axis of mark camera 25 is tilted at an angle, may misdetect the component position deviation. The light axis deviation amount acquiring processing is for acquiring a deviation amount for setting a correction value to prevent such misdetection of the mounting shift due to the tilted angle of the light axis.

Next, CPU 41 images the mounting state of jig board S0 rotated 180 degrees (reversed) in a horizontal plane from the reference angle using mark camera 25 (S320). Note that, the rotation of jig board S0 may be performed by board rotating device, which is not shown, inside board conveyance unit 12, or may be performed by an operator. Continuing, CPU 41 acquires the difference ΔP2 (ΔXp2, ΔYp2) between the component center and the image center from the image captured in S320 (S330). When jig board S0 for which a component center is shifted with respect to target mounting center C is rotated 180 degrees (reversed) in a horizontal plane, as shown in FIG. 8(*b*), the component center is moved to a symmetrical position centered around target mounting center C.

Note that, so long as the position of mark camera 25 does not change, the image center does not change. Therefore, after rotation, the component center is shifted with respect to the target mounting center C in the left direction of FIG. 8(*b*) by ΔP0 (ΔXp0 assuming the X direction). Further, in the image captured by mark camera 25 after rotation, the component center appears shifted with respect to the image center in the left direction by ΔP2 (ΔXp2 assuming the X direction). That is, before and after rotation, the visual difference (deviation amount) from the image center to the component center is enlarged. However, because there is no change in the image center and the target mounting center C before and after rotation, equation (1) below can be derived from FIGS. 8(*a*) and (*b*). Note that, although not described or shown in the figures, there are cases in which the difference (deviation amount) from the image center to the component center appears to shrink, and equation (1) applies similarly to these cases. Further, from equation (1), ΔP0 can be calculated as in equation (2).

$$\Delta P2 = \Delta P1 + 2 \times \Delta P0 \quad (1)$$

$$\Delta P0 = (\Delta P2 - \Delta P1)/2 \quad (2)$$

Continuing, CPU 41 acquires light axis deviation amount ΔP (ΔXp, ΔYp) based on the difference ΔP1, ΔP2 acquired in S310 and S330 (S340), then ends light axis deviation amount acquiring processing. Here, light axis deviation amount ΔP is the distance from the image center to target mounting center C. Therefore, for example, in FIG. 8(*a*) this is (ΔP1+ΔP0), and in FIG. 8(*b*) this is (ΔP2−ΔP0), so using ΔP0 of equation (2), the light axis deviation amount ΔP can be represented by equation (3). CPU 41 enters difference ΔP1 and ΔP2 into equation (3) to obtain the light axis deviation amount ΔP. Note that, CPU 41 calculates the light axis deviation amount ΔXp, ΔYp in each of the X and Y directions. Note that, equations (1), (2), and (3) represent examples based on FIG. 8, and the use of positive and negative signs in the equations is not restricted to those shown. Further, ΔP0, ΔP1, and ΔP2 are described as being used to calculate the deviation amount (size of difference), but this is not a restriction, and the deviation amount may be a vector that represents a deviation amount and a deviation direction.

$$\Delta P = (\Delta P1 + \Delta P2)/2 \quad (3)$$

Returning to descriptions of the correction value setting processing of FIG. 4. CPU 41 sets a dedicated correction value of an upper surface recognition component based on the mounting position deviation amount ΔXs, ΔYs and the light axis deviation amount ΔXp, ΔYp acquired as described above. Processing of S120 is performed by adding light axis deviation amount ΔXp, ΔYp respectively to the mounting position deviation amount ΔXs, ΔYs acquired for each specified angle d for each individual suction nozzle 24. That is, a dedicated correction value is set for each of the X and Y directions. Also, CPU 41, by performing the processing of S100 to S120 for each type of upper surface recognition component, is able to set a dedicated correction value for each type of upper surface recognition component. CPU 41, upon setting the dedicated corrections values, registers dedicated correction value* with a name corresponding to component information PD* of the upper surface recognition component for which that dedicated correction value applies (130), then ends correction value setting processing. Note that, component information PD* includes information required for mounting such as component name, component size, mounting position, mounting angle, recognition surface (whether upper surface recognition is required) in accordance with the mounting order. CPU 41, for example, acquires component information PD* from a production program or the like received from management computer 50, and memorizes the component information PD* on HDD 43.

Figure 9:
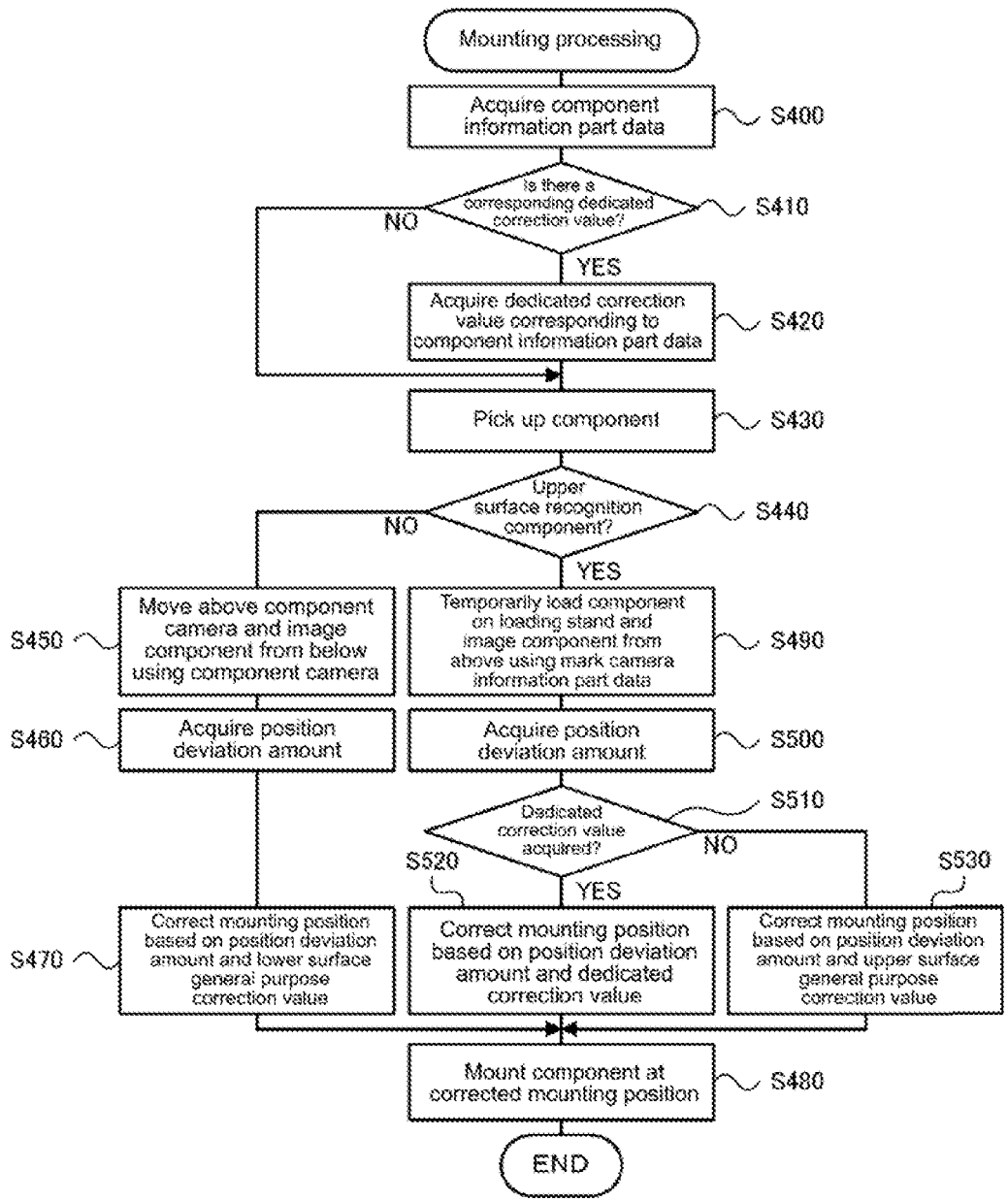
FIG. 9 is a flowchart illustrating an example of mounting processing.
Figure 10:
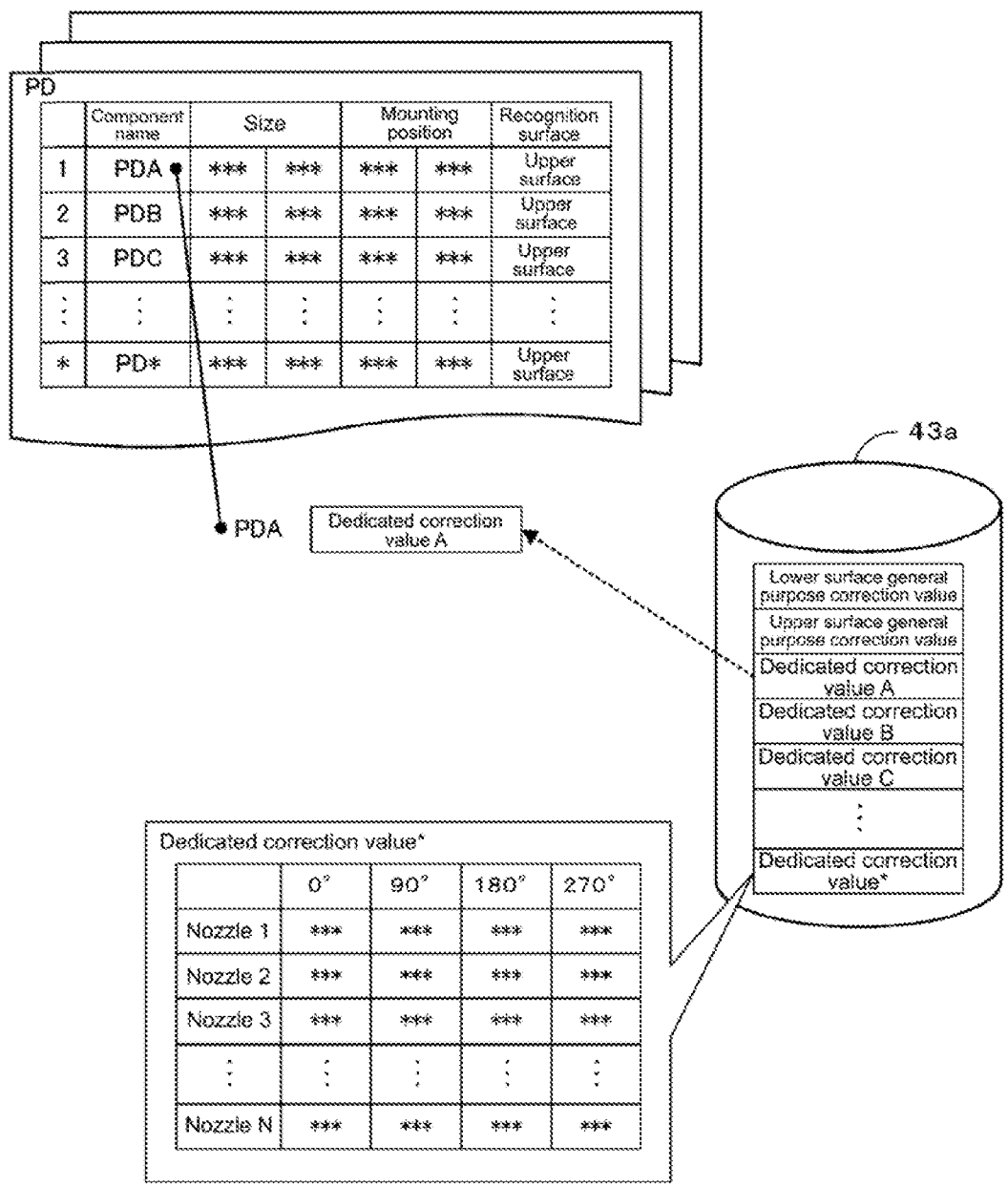
FIG. 10 shows an example of component information PD and dedicated correction values.

Mounting processing performed at mounter 11 is described below. FIG. 9 is a flowchart showing an example of mounting processing. With the mounting processing of FIG. 9, CPU 41 of control device 40, first, acquires component information PD of the component that is the target for mounting processing (S400), and if there are dedicated correction values corresponding to that component information PD in the correction value folder of HDD 43, acquires those dedicated correction values (S410, S420). FIG. 10 shows an example of component information PD and dedicated correction values. Note that, in FIG. 10, a case is shown in which dedicated correction value A is automatically acquired when acquiring component information PDA. As described above, the dedicated correction value is memorized in correction value folder 43*a* with a name corresponding to the component information PD. Therefore, when acquiring component information PD* it is easy to acquire the corresponding dedicated correction values* from correction value folder 43*a*. Correction value folder 43*a*, as well as storing multiple dedicated correction values corresponding to the component information PD* of multiple types of upper surface recognition components, also stores lower surface general-purpose correction values that are general-purpose correction values for lower surface recognition components and upper surface general-purpose correction values that are general-purpose correction values for upper surface recognition components. Note that, upper surface general-purpose corrections values include correction values based on light axis deviation amounts ΔXp, ΔYp of mark camera 25.

Next, CPU 41 uses suction nozzles 24 of mounting head 22 to pick up components (S430), and determines whether the component to be mounted is an upper surface recognition component (S440). CPU 41, if determining that the component to be mounted is not an upper surface recognition component, moves mounting head 22 above component camera 15, images the component held by suction nozzle 24 from below using component camera 15 (S450), and acquires the position deviation amount of the outline center of the component based on the captured image. Then, CPU 41 corrects the component mounting position to decrease the mounting deviation based on the position deviation amount and the lower surface general-purpose correction value in correction value folder 43a (S470), controls head moving section 20 and mounting head 22 to mount the component at the corrected mounting position (S480), and ends mounting processing.

On the other hand, if determining in S440 that the component to be mounted is an upper surface recognition component, CPU 41 temporarily loads the upper surface recognition component held by the suction nozzle 24 on loading stand 18 and images the component from above using mark camera 25 (S490), then acquires the position deviation amount of characteristic section 61 of the component based on the captured image (S500). Next, CPU 41 determines whether the dedicated correction value of the current upper surface recognition component was acquired in the above S420 (S510), and if determining that it was acquired, corrects the component mounting position based on the mounting deviation amount and the dedicated correction value (S520), controls head moving section 20 and mounting head 22 to mount the component at the corrected mounting position (S480), then ends mounting processing. CPU 41, in S520, corrects the component mounting position for each suction nozzle 24 using a value offset in the Y direction and offset in the X direction from the dedicated correction value corresponding to the mounting angle of the current upper surface recognition component to offset the Y-direction position deviation amount and the X-direction position deviation amount of characteristic section 61. CPU 41, if the component mounting angle is an angle not registered in the dedicated correction values, uses a value interpolated from a dedicated correction value of a similar angle. On the other hand, if determining that the dedicated correction values have not been acquired in S510, because the dedicated corrections values are not registered in correction value folder 43a, CPU 41 corrects the component mounting position based on the position deviation amount and the upper surface general-purpose correction value from correction value folder 43a (S530), controls head moving section 20 and mounting head 22 to mount the component at the corrected mounting position (S480), then ends mounting processing.

Figure 11:
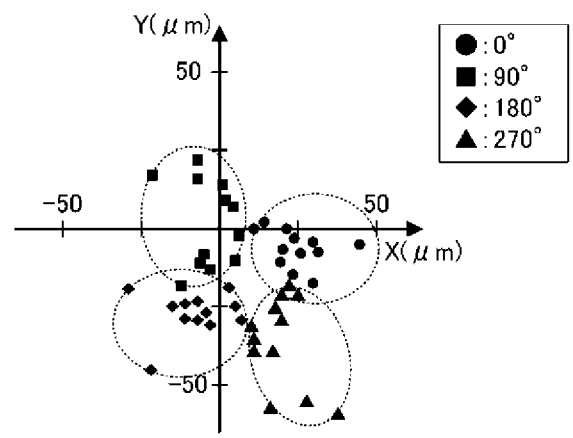
FIG. 11 shows the relationship between whether there is a dedicated correction value and a position deviation amount.
Figure 11:
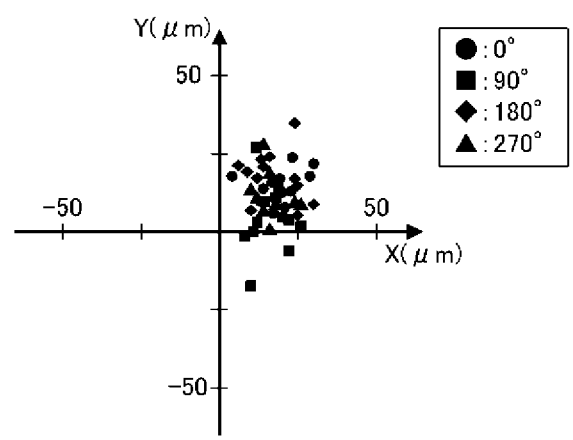
Figure 11:
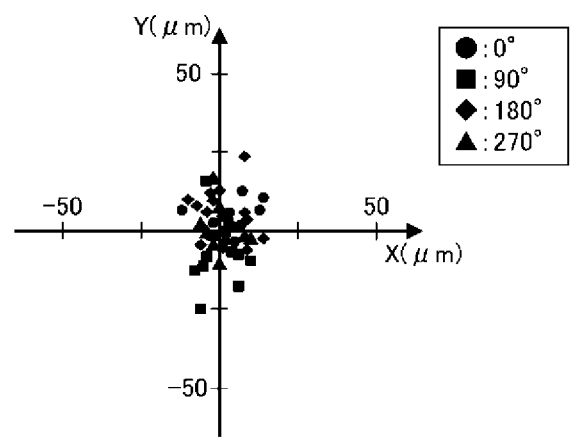

FIG. 11 shows the relationship between whether there is a dedicated correction value and a position deviation amount of the characteristic section. FIG. 11(a) shows position deviation amounts for a case in which upper surface recognition components were mounted using correction values shared for use with lower surface recognition components (lower surface general-purpose correction values), that is, a case in which upper surface recognition components were mounted without using dedicated correction values. As shown, when not using dedicated correction values, large position deviations occur for characteristic section 61, with position deviations sometimes exceeding 50 μm. Also, the position deviation directions for each angle differ considerably (refer to the circled points in FIG. 11[a]). FIG. 11(b) shows position deviation amounts for a case in which upper surface recognition components were mounted using dedicated correction values not including correction with respect to the light axis deviation of mark camera 25; FIG. 11(c) shows position deviation amounts for a case in which upper surface recognition components were mounted using dedicated correction values including correction with respect to the light axis deviation of mark camera 25. The present embodiment includes correction with respect to the light axis deviation in the dedicated correction values, but correction does not have to include correction with respect to the light axis deviation, with an example of this case being shown in FIG. 11(b). As shown in FIG. 11(b), the position deviation amount of characteristic section 61 is considerably reduced by using dedicated correction values of upper surface recognition components. Also, the large difference in the direction of the position deviation for each angle is curtailed such that the overall range of the position deviations is smaller. Further, by using dedicated correction values including correction of the light axis deviation as in the present embodiment, as shown in FIG. 11(c), the position deviation of characteristic section 61 is further reduced, thereby considerably improving mounting accuracy.

Correspondences between constituent elements of the present embodiment and constituent elements of the disclosure will be clarified here. Mounting head 22 of the present embodiment corresponds to a mounting head of the present disclosure, HDD 43 corresponds to a memory section, mark camera 25 corresponds to an upper imaging device, and control device 40 that performs the mounting processing of FIG. 9 corresponds to a control section. Component camera 15 corresponds to a lower imaging device, control device 40 that performs processing of S100 of the correction value setting processing of FIG. 4 (the mounting position deviation amount acquiring processing of FIG. 5) corresponds to a position deviation amount acquiring section, and control device 40 that performs processing of S120 and S130 of the correction value setting processing of FIG. 4 corresponds to a correction value setting section. Control device 40 that performs processing S110 of the correction value setting processing of FIG. 4 (the light axis deviation amount acquiring processing of FIG. 7) corresponds to a light axis deviation amount acquiring section.

Mounter 11 as described above memorizes dedicated correction values (specific correction values) related to a mounting position of a specific component (upper surface recognition component) 60 with characteristic section 61 on an upper surface thereof in correction value folder 43a of HDD 43, and when performing mounting work of mounting the specific component 60 on a board S, acquires a position deviation amount of characteristic section 61 based on an image of the upper surface of the specific component 60 captured by mark camera 25, and mounts the specific component 60 at a mounting position corrected based on the acquired position deviation amount and the dedicated correction values. Accordingly, it is possible to mount the specific component 60 at a corrected mounting position such that the position of characteristic section 61 is appropriate, thereby improving mounting accuracy for the specific component 60.

Also, mounter 11 is provided with component camera 15 capable of imaging components from below and memorizes a lower surface general-purpose correction value related to the mounting position of general-purpose components (lower surface recognition components, non-specific components) in correction value folder 43a of HDD 43, and in a case of performing mounting work of mounting a general-purpose component on board S, acquires a general-purpose position deviation amount based on an image of the lower surface of the general-purpose component captured by component camera 15, and mounts the general-purpose at the mounting position corrected based on the acquired position deviation amount and the general-purpose correction value. Accordingly, it is possible to separately correct the mounting positions for specific components 60 with characteristic section 61 on an upper surface thereof and the mounting positions for general-purpose components without a characteristic section on an upper surface thereof. Therefore, dedicated correction values can be used for specific components 60, thereby improving the mounting accuracy of specific components 60.

Also, mounter 11 acquires the position deviation amount of specific component 60 with respect to a target position based on an image of jig board S0 on which specific component 60 is mounted at a specified target position using mark camera 25, sets in advance a dedicated correction value based on the acquired position deviation amount, and memorizes the dedicated correction amount in correction value folder 43a of HDD 43. Therefore, highly accurate dedicated correction values can be memorized based on the mounting states of specific components.

Further, there are multiple different types of components among specific components 60, and multiple dedicated correction values that are predetermined for each type of specific component 60 are memorized in correction value folder 43a of HDD 43. For different types of specific components 60, because the position, size, functionality, characteristics, manufacturing method and so on of characteristic section 61 is different, the position deviation of characteristic section 61 varies depending on the type of specific component 60. Therefore, by using predetermined dedicated correction values for each type of specific component 60, the mounting accuracy of specific components 60 can be further improved.

Also, mounter 11 performs mounting work based on component information PD for each component required for mounting, and correction value folder 43a of HDD 43 memorizes dedicated correction values under a name corresponding to the component information PD corresponding to the type of specific component, therefore it is possible to easily perform correction by reading the dedicated correction value corresponding to the type of specific component.

Further, because dedicated correction values including a correction value of the position deviation amount based on the angle of the light axis of mark camera 25 are memorized, it is possible to curtail worsening of the mounting accuracy of specific components 60 due to the angle of the light axis of mark camera 25.

Further, mounter 11, based on a first image captured by mark camera 25 of jig board S0 on which specific component 60 is mounted at a specified target position, acquires a first position deviation amount $\Delta P1$ that is a position deviation amount of specific component 60 with respect to the target position, and based on a second image captured by mark camera 25 of jig board S0 rotated by a specified angle (for example, 180 degrees) in a horizontal plane from the imaging position of the first image, acquires a second position deviation amount $\Delta P2$ that is a position deviation amount of specific component 60 with respect to the target position, then, based on the first position deviation amount $\Delta P1$ and the second position deviation amount $\Delta P2$, acquires a position deviation amount based on the angle of mark camera 25. Therefore, it is possible to acquire with good accuracy and easy processing the position deviation amount based on the angle of the light axis of mark camera 25 without preparing a dedicated jig or the like.

Meanwhile, it goes without saying that the disclosure is not limited to the above-mentioned embodiment and various embodiments may be applied within the technical scope of the disclosure.

For example, in an embodiment above, dedicated correction values of upper surface recognition components are memorized in correction value folder 43a under a name corresponding to the component information PD, but the configuration is not limited to this, so long as the dedicated correction values are memorized in correction value folder 43a such that identification of the type of upper surface recognition component is possible, it is not necessary to memorize the dedicated correction values corresponding to the component information PD.

In an embodiment above, dedicated correction values of upper surface recognition component 60 are memorized by each angle for each individual suction nozzle 24, but the configuration is not limited to this, dedicated correction values may be memorized for each individual suction nozzle 24 (each individual nozzle position) without being memorized for each angle, or may be memorized for each angle without being memorized for each individual suction nozzle 24 (each individual nozzle position). In other words, one correction value may be used as a dedicated correction value of an upper surface recognition component 60.

In an embodiment above, the dedicated correction values of the upper surface recognition components are memorized for each component type, but the configuration is not limited to this, a shared correction value may be used for multiple upper surface recognition components, or a shared correction value may be used for all upper surface recognition components.

In an embodiment above, in the correction value setting processing, dedicated correction values are set after acquiring a position deviation amount of an upper surface recognition and a position deviation amount based on the light axis deviation of mark camera 25, but the configuration is not limited to this. For example, a correction value based on the light axis deviation of mark camera 25 may be acquired in advance using a reference component or the like. However, because the influence of the light axis deviation varies depending on the component height, it is desirable to acquire a correction value of the light axis deviation using an actual component.

In an embodiment above, a result of mounting a component on jig board S0 is imaged by mark camera 25 to acquire a position deviation amount of the upper surface recognition component, but the configuration is not limited to this, so long as the position deviation amount is acquired by imaging the result of mounting the component on jig board S0 from above. Therefore, it is not essential to acquire the position deviation amount of the upper surface recognition component using mounter 11 with mark camera 25 attached to head 22. For example, the position deviation amount may be acquired by an inspection machine for performing inspecting work of board S that is equipped with a camera capable of imaging board S from above but not equipped with mounting head 22. In other words, the configuration may be a board work machine for performing specified work with respect to a board, the board work machine including: an upper imaging device configured to image the board from above; a position deviation amount acquiring section configured to acquire a position deviation amount of a specific component with respect to a specified target position based on an image captured by the upper imaging device of the board on which the specific component has been mounted at the specified target position, and a correction value setting section configured to set the specific correction value with respect to the mounting position of the specific component based on the position deviation amount. With such a board work machine too, because a position deviation amount of the specific component with respect to a specified target position is acquired based on an image captured by the upper imaging device of the board on which the specific component has been mounted at the specified target position, and the specific correction value related to the mounting position of the specific component is set based on that position deviation amount, it is possible to set the specific correction value with easy processing. By this, the mounter can perform mounting work using specific correction values, thereby improving mounting accuracy of specific components. Also, in this case, the inspection machine may perform the processing of S240, S250, and S270 of the mounting position deviation amount acquiring processing of FIG. 5, and the processing of S120 of the correction value setting processing of FIG. 4.

In an embodiment above, in S320 of the light axis deviation amount acquiring processing of FIG. 7, jig board S0 is rotated 180 degrees and then ΔP2 is acquired, but the configuration is not limited to this, jig board S0 may be rotated by any specified angle from a reference angle (for example, 0 degrees). For example, in S320, jig board S0 may be rotated by 90 degrees and then ΔP2 may be acquired.

In an embodiment above, a correction value for correcting the light axis deviation of mark camera 25 is included in the dedicated correction value, but the configuration is not limited to this, and the dedicated correction value does not have to include a correction value for the light axis deviation.

INDUSTRIAL APPLICABILITY

The present disclosure may be applied to a board work machine that performs specified work such as mounting components on a board.

REFERENCE SIGNS LIST

10: mounting system; 11: mounter; 12: board conveyance unit 13: mounting unit 14: component supply unit 15: component camera; 18: loading stand; 20 head moving section; 22: mounting head 23: Z-axis motor; 24: suction nozzle; 25: mark camera; 26: imaging region; 31: attachment section; 32: feeder; 33: reel; 34: tape; 35: tray unit; 36: pickup position; 40: control device; 41: CPU; 42: ROM; 43: HDD; 43a: correction value folder; 44: RAM; 45: input-output interface; 46: bus; 50: management computer; 52: input device; 54: display; 60: specific component; 61: characteristic section; 61c: center; 62: contact surface; S: board

The invention claimed is:

1. A board work machine for performing specified work with respect to a board, the board work machine comprising:
a mounting head configured to pick up a component and move the component to a mounting position on the board;
a memory section configured to memorize a correction value related to the mounting position of the component and to memorize at least a specific correction value related to the mounting position of a specific component that includes a specified characteristic section on an upper surface of the specific component;
an upper imaging device configured to image the component from above; and
a control device configured to, in a case of performing mounting work of mounting the specific component on the board, acquire a position deviation amount of the specific component based on an upper surface image of the upper surface of the specific component captured by the upper imaging device and control the mounting head to mount the specific component at the mounting position corrected based on the acquired position deviation amount and the specific correction value.

2. The board work machine of claim 1, further comprising a lower imaging device configured to image the component from below,
wherein
the memory device is configured to memorize a non-specific-component-use correction value related to a mounting position of a non-specific component that does not have a specified characteristic section on an upper surface of the non-specific component, and
the control device is configured to, in a case of performing mounting work of mounting the non-specific component on the board, acquire a position deviation amount of the non-specific component based on a lower surface image of a lower surface of the non-specific component captured by the lower imaging device and control the mounting head to mount the non-specific component at the mounting position corrected based on the acquired position deviation amount and the non-specific-component-use correction value.

3. The board work machine of claim 1, further comprising a position deviation amount acquiring section configured to acquire the position deviation amount of the specific component with respect to a specified target position based on an image captured by the upper imaging device of the board on which the specific component has been mounted at the specified target position, and
a correction value setting section configured to set the specific correction value based on the position deviation amount,
wherein
the memorizing section memorizes the specific correction value set by the correction value setting section.

4. The board work machine of claim 1, wherein
as the specific component there are multiple different types of components,
the memorizing section memorizes, as the specific correction value, multiple dedicated specific correction values predetermined for each of the types of the specific components, and
the control section, in a case of mounting the specific component, reads from the memory section and uses the dedicated specific correction value in accordance with the type of the specific component.

5. The board work machine of claim 4, wherein
the control device is configured to control the mounting head to perform the mounting work based on component information of each component required for mounting, and
the memory section is configured to memorize the dedicated specified correction value under a name corresponding to the component information set for each type of the specific components.

6. The board work machine of claim 1, wherein
the memory section is configured to memorize, as the specific correction value, a value including a correction value of a position deviation amount based on an angle of a light axis of the upper imaging device.

7. The board work machine of claim 6, further comprising
a light axis deviation amount acquiring section configured to acquire a position deviation amount based on an angle of the light axis of the upper imaging device, wherein
the light axis deviation amount acquiring section is configured to acquire
a first position deviation amount that is a position deviation amount of the specific component with respect to the target position based on a first image captured by the upper imaging device of the board mounted with the specific component at the specified target position,
a second position deviation amount that is a position deviation amount of the specific component with respect to the target position based on a second image imaged by the upper imaging device of the board rotated by a specified angle in a horizontal plane from the capturing of the first image, and
a position deviation amount based on the angle of the light axis of the upper imaging device based on the first position deviation amount and the second position deviation amount.

* * * * *